United States Patent
Rahimo et al.

(10) Patent No.: US 9,722,040 B2
(45) Date of Patent: Aug. 1, 2017

(54) METHOD FOR MANUFACTURING AN INSULATED GATE BIPOLAR TRANSISTOR

(71) Applicant: ABB Schweiz AG, Baden (CH)

(72) Inventors: Munaf Rahimo, Uezwil (CH); Maxi Andenna, Dättwil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/867,327

(22) Filed: Sep. 28, 2015

(65) Prior Publication Data
US 2016/0020298 A1    Jan. 21, 2016

Related U.S. Application Data

(63) Continuation of application No. PCT/EP2014/056269, filed on Mar. 28, 2014.

(30) Foreign Application Priority Data

Mar. 28, 2013 (EP) ..................................... 13161693

(51) Int. Cl.
*H01L 29/66* (2006.01)
*H01L 29/739* (2006.01)
(Continued)

(52) U.S. Cl.
CPC .... *H01L 29/66325* (2013.01); *H01L 29/0834* (2013.01); *H01L 29/36* (2013.01);
(Continued)

(58) Field of Classification Search
CPC ................. H01L 29/0834; H01L 29/36; H01L 29/66325; H01L 29/66333; H01L 29/7395;
(Continued)

(56) References Cited

U.S. PATENT DOCUMENTS

| | | | | |
|---|---|---|---|---|
| 5,838,027 A | * | 11/1998 | Kim | .................... H01L 29/7395 257/139 |
| 2003/0042525 A1 | * | 3/2003 | Tanaka | .............. H01L 29/41741 257/302 |

(Continued)

FOREIGN PATENT DOCUMENTS

| | | |
|---|---|---|
| EP | 0365107 A2 | 4/1990 |
| EP | 0365107 A3 | 1/1991 |

(Continued)

OTHER PUBLICATIONS

European Search Report Application No. EP13161693.0 Completed: Aug. 2, 2013; Mailing Date: Aug. 21, 2013 8 pages.

*Primary Examiner* — Thanh T Nguyen
(74) *Attorney, Agent, or Firm* — Whitmyer IP Group LLC

(57) ABSTRACT

Method for manufacturing an insulated gate bipolar transistor, which includes a drift layer of a first conductivity type between an emitter side, at which a gate and emitter electrode are arranged, and a collector side, at which a collector electrode is arranged including steps:
    providing a substrate of a second conductivity type,
    applying a dopant of the first conductivity type on the first side,
    creating a drift layer of the first conductivity type on the first layer,
    diffusing the ions such that a buffer layer is created, having a higher doping concentration than the drift layer,
    creating a base layer of the second conductivity type on the drift layer,
    creating an emitter layer of the first conductivity type on the base layer,
    thinning the substrate on the second side such that the remaining part of the substrate forms a collector layer.

17 Claims, 9 Drawing Sheets

(51) Int. Cl.
  *H01L 29/36* (2006.01)
  *H01L 29/08* (2006.01)
(52) U.S. Cl.
  CPC .... *H01L 29/66333* (2013.01); *H01L 29/7395* (2013.01); *H01L 29/0804* (2013.01); *H01L 29/0821* (2013.01)
(58) Field of Classification Search
  CPC ......... H01L 29/66287; H01L 29/41708; H01L 29/0804; H01L 29/0821; H01L 29/7325; H01L 29/7322; H01L 29/7396; H01L 29/7397; H01L 29/7398
  USPC ....................................................... 438/135
  See application file for complete search history.

(56) References Cited

U.S. PATENT DOCUMENTS

| | | | |
|---|---|---|---|
| 2007/0290237 | A1 | 12/2007 | Nakagawa |
| 2010/0078765 | A1 | 4/2010 | Schulze et al. |
| 2014/0070268 | A1* | 3/2014 | Yoshimura .......... H01L 29/0834 257/139 |

FOREIGN PATENT DOCUMENTS

| | | |
|---|---|---|
| JP | 2006086423 A | 3/2006 |
| WO | 2013136898 A1 | 9/2013 |

\* cited by examiner

METHOD FOR MANUFACTURING AN INSULATED GATE BIPOLAR TRANSISTOR

FIELD OF THE INVENTION

The invention relates to the field of power electronics and more particularly to a method for manufacturing an insulated gate bipolar transistor.

BACKGROUND OF THE INVENTION

In US 2012/0025261 A1 a method for the manufacturing of an insulated gate bipolar transistor (IGBT) is described. The method starts with a lowly or non doped substrate, which may be of n-type or p-type. The doping concentration of this layer with its value of less than $1*10^{15}$ cm$^{-3}$ is at maximum in the order of the doping concentration of the drift layer so that this layer does not contribute much charge to a p collector layer. On this substrate an n doped buffer layer is epitaxially grown with a thickness of 5 to 10 μm followed by another epitaxial growth for the creation of an (n−) doped drift layer. Afterwards a p doped base layer together with an (n+) doped emitter layer are created on the drift layer. On the same side, a gate electrode is then made. Now the substrate is thinned on the side opposite to the first epitaxial layer so that a thin lowly or non doped layer remains. On this layer a p ions are implanted and diffused in order to form the collector layer.

This method uses a substrate which does not fulfil any function in the finalized device so that for each layer at least one manufacturing step is needed. The device is thicker than electrically needed because of the remaining low doped or non doped part of the substrate. The collector layer is made at a late stage of the manufacturing and with the thinned substrate, which means that the emitter sided layer are exposed to the high temperature used for the diffusion of the collector layer and the thinned substrate is fragile to handle.

JP 2006-086423 A shows a manufacturing method for an IGBT, in which a highly doped p+ substrate having a doping concentration of 1*1018 cm−3 is provided. On the substrate, an n+ doped buffer layer having a thickness of 5 μm is epitaxially grown. This layer has a constant high doping concentration in the depth direction, which is the same doping concentration as the substrate. The layer thickness and doping of such pure epitaxial layer is difficult to control. Due to the high doping concentration of buffer and collector layers, the collector injection efficiency is very high which leads to high injection of holes into the drift layer. The turn-off of the device is slow because of the high amount of stored charge in the drift layer and low injection of electrons into the collector layer. US 2003/42525 A1 shows similar disadvantages of a purely epitaxially grown buffer layer.

U.S. Pat. No. 5,838,027 shows a method, in which a p+ substrate is provided, on which a n− lowly doped epitaxial layer is grown. In this layer, an n+ dopant is implanted and diffused. Afterwards a lowly doped n− drift layer is created on the buffer layer. Such method shows a complicated way with many manufacturing steps for the creation of the buffer layer. Due to the diffusion of the n+ dopant in the n− layer, at the junction to the collector layer, the buffer layer has a low doping concentration, rising to its maximum doping concentration at a greater depth and again decreasing to the doping concentration of the n− drift layer, thereby increasing the total thickness of the semiconductor.

SUMMARY OF THE INVENTION

It is an object of the invention to provide a method for manufacturing an insulated gate bipolar transistor, which avoids the problems of prior art methods.

This object is achieved by providing a method for manufacturing an insulated gate bipolar transistor, which comprises a drift layer of a first conductivity type between an emitter side, at which a gate electrode and an emitter electrode are arranged, and a collector side opposite to the emitter side, at which a collector electrode is arranged. The manufacturing method comprises manufacturing steps in the following order:

providing a substrate of a second conductivity type, which is opposite to the first conductivity type, having a first and a second side opposite to the first side, creating a first layer of the first conductivity type on the first side by applying a dopant of the first conductivity type, creating a drift layer of the first conductivity type on the first layer, which has a low doping concentration, diffusing the dopant such that a buffer layer is created, wherein the buffer layer has a higher doping concentration than the drift layer, creating a base layer of the second conductivity type on the drift layer, creating an emitter layer of the first conductivity type on the base layer, and thinning the substrate on the second side such that the remaining part of the substrate forms a collector layer.

Due to the diffusion process used for the creation of the buffer layer, there is better control of the layer thickness and doping concentration due to the spreading of the doped ions by the diffusion than for a method using only epitaxial growth for the creation of the buffer layer.

As in this method, no thinning in a profiled doping region of the buffer layer is done. Thus, the thickness and doping concentration of the buffer layer can be well controlled.

Due to the drift layer being made by epitaxial growth, or for the buffer layer by diffusion of a dopant into the epitaxial layer (i.e. into the drift layer), the layers are of high quality. For the collector layer, a substrate can be used with less stringent specifications and, thus, a lower cost impact.

The inventive method can easily be applied for large wafer diameter processing, because the whole manufacturing process for layers, gate electrode and metallization on the emitter side can be performed with a thick substrate and only the metallization process for the collector electrode (and optionally for the emitter electrode) is performed on the thinned substrate. Not even the collector layer has to be created on the thinned substrate so that all layer creation of doped layers (emitter and collector sided layers) can be performed on a thick substrate without the risk due to thin substrate handling.

As the collector layer is part of the substrate from the beginning on, no high temperature steps like diffusion or laser annealing are needed for its creation after having introduced the emitter sided layers and gate electrode. Therefore, this method combines the advantage of thick substrate handling without any need of high temperature steps at a late manufacturing stage.

With the inventive manufacturing method, a soft-punch through device can be created, in which the buffer layer has a rather low doping concentration and rather high thickness compared to prior art devices, which can be produced by an easily controllable process without delicate steps with thin wafer handling. The deep diffused layer offers a gradient profile with no constant doping section of the buffer when compared to a buffer formed by a pure epitaxial layer or a deposited layer.

This gradient buffer allows the electric field to expand into the buffer regions through the lower doped region while ensuring a neutral highly doped region where the electric field does not reach. The highly doped region closer to the anode is important for controlling the bipolar gain for improved leakage current and short circuit capability trade-off.

The collector injection efficiency of the collector can be controlled by choosing collector layer thickness and a substrate with suitable doping concentration independently of the risk of high temperature steps (e.g. laser annealing) in the ends of the manufacturing. This can give advantages of lower conduction losses in the device.

BRIEF DESCRIPTION OF THE DRAWINGS

The subject matter of the invention will be explained in more detail in the following text with reference to the attached drawings, in which.

DETAILED DESCRIPTION OF THE INVENTION

Figure 1:
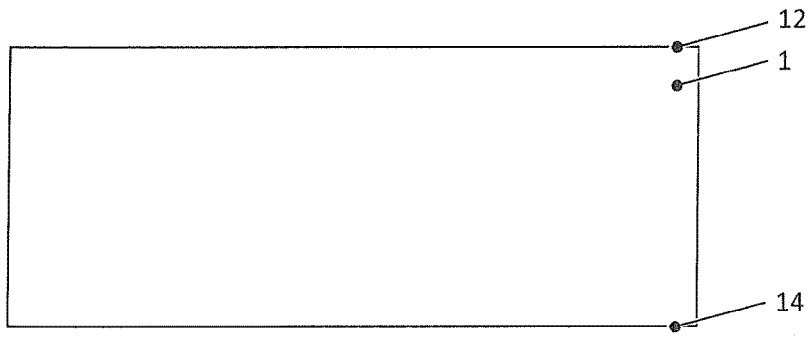
FIGS. 1 to 9 show different manufacturing steps according to the invention for the manufacturing of an IGBT.
Figure 2:
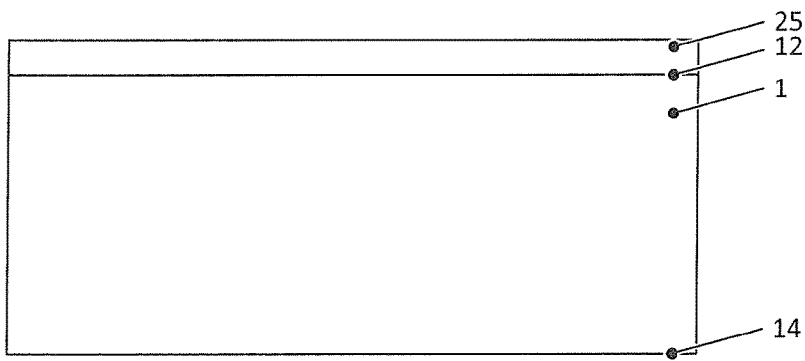
Figure 3:
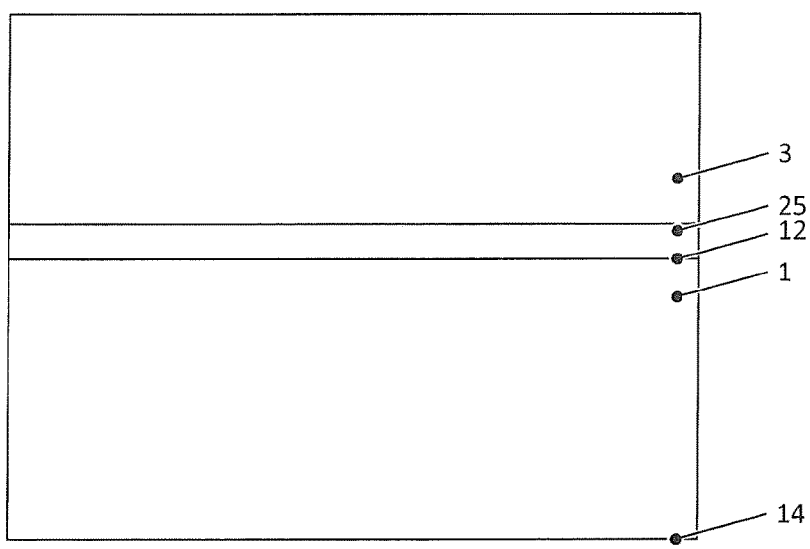
Figure 4:
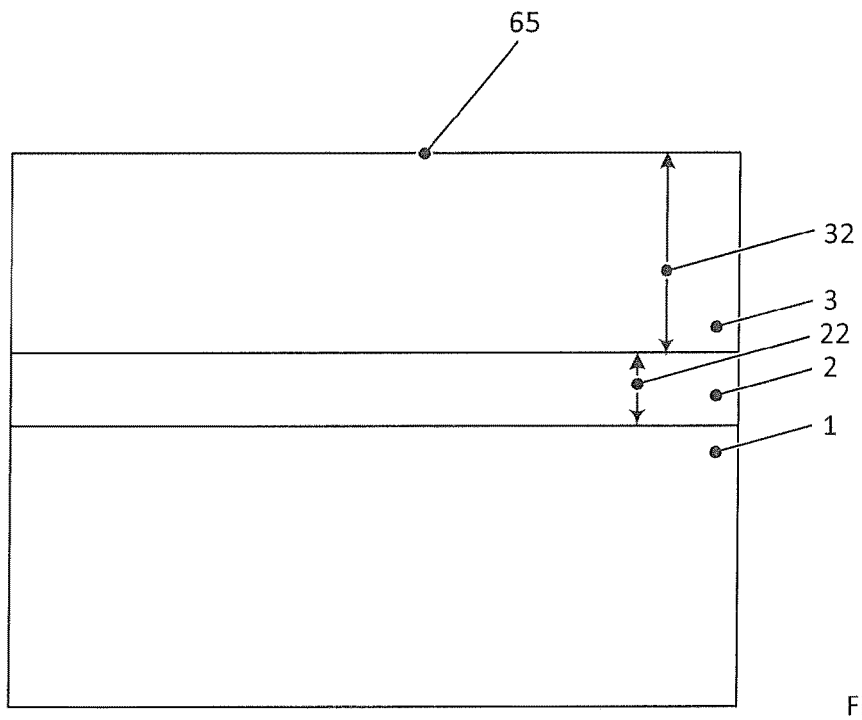
Figure 6:
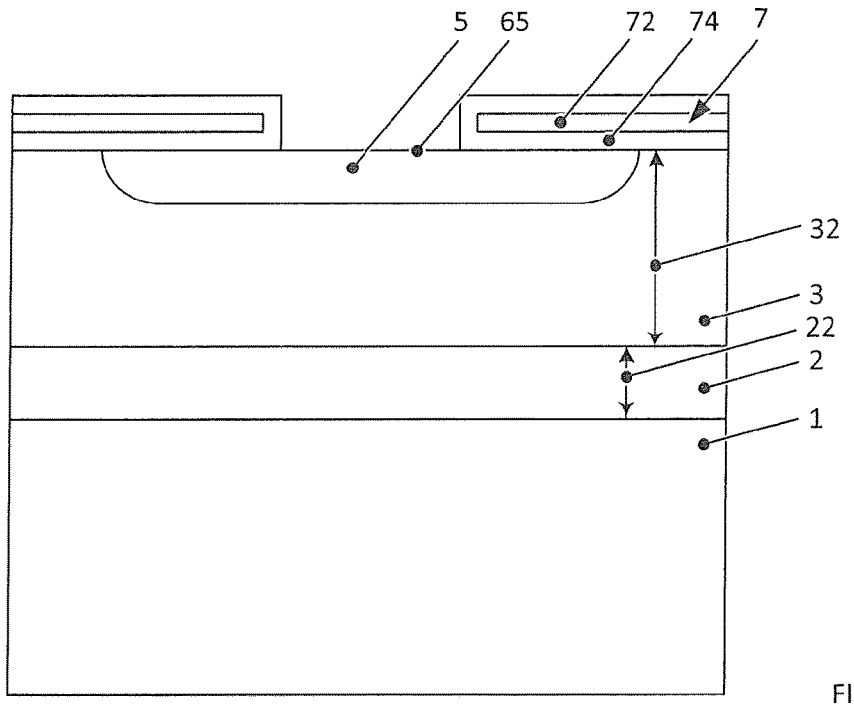
Figure 7:
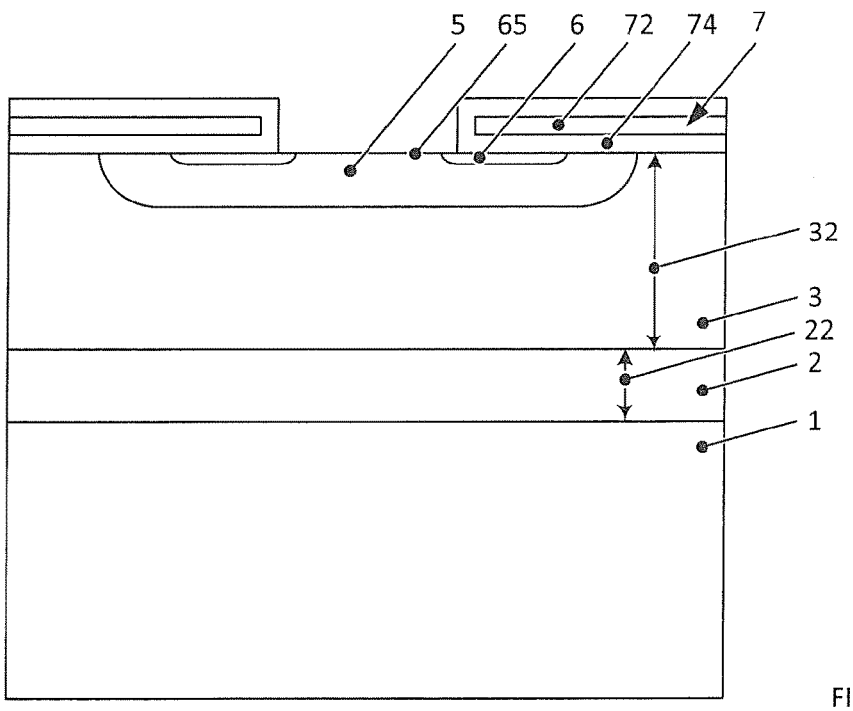
Figure 8:
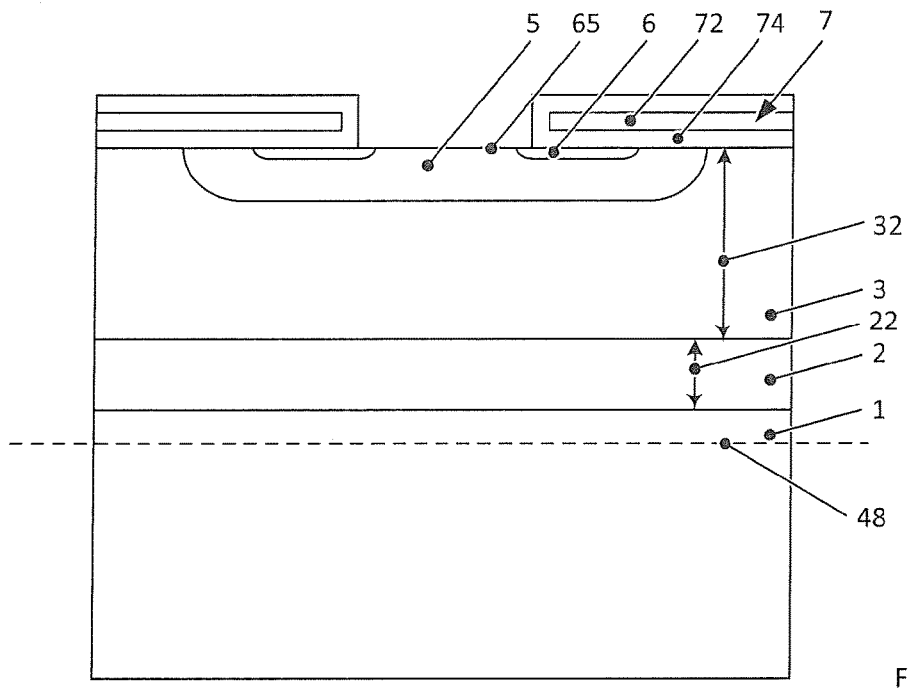
Figure 9:
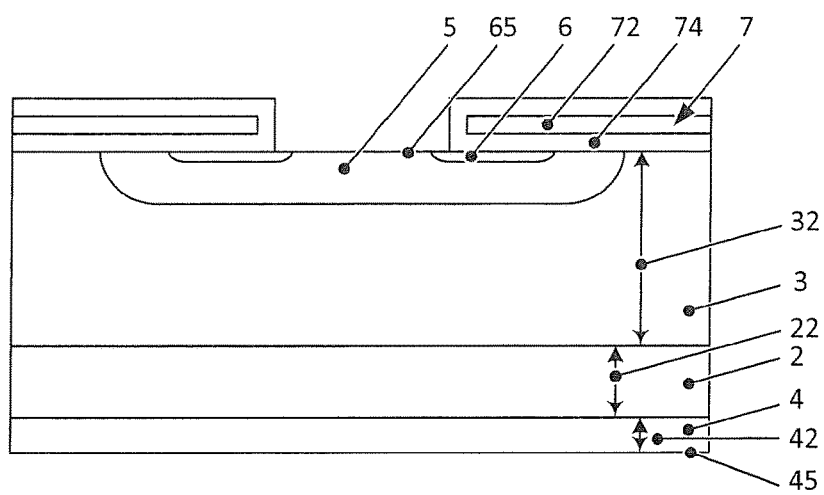

For manufacturing an inventive insulated gate bipolar transistor (IGBT) 10 the manufacturing steps are performed in the following order:

providing a p doped substrate 1 having a first and a second side 12, 14 opposite to the first side (FIG. 1), creating an n type first layer 25 on the first side 12 by applying an n dopant (FIG. 2), creating an (n−) doped drift layer 3 on the first layer 25, which has a low doping concentration, exemplarily by epitaxial growth (FIG. 3), diffusing the dopant introduced in layer 25 such that a buffer layer 2 having a buffer layer thickness 22 is created (FIG. 4), wherein the buffer layer 2 has a higher doping concentration than the drift layer 3, creating a p doped base layer 5 on the drift layer 3 (FIG. 6), creating an (n+) doped emitter layer 6 on the base layer 5 (FIG. 7), thinning 48 the substrate 1 on the second side 14 such that the remaining part of the substrate forms a collector layer 4 (FIG. 8 showing the thinning and FIG. 9 showing the resulting collector layer 45).

At any appropriate manufacturing step, a gate electrode 7, which is attached to the base layer 5 and the emitter layer 6, and an emitter electrode 8, which is in contact to the base layer 5 and the emitter layer 6 at an emitter contact area, are created.

Figure 5:
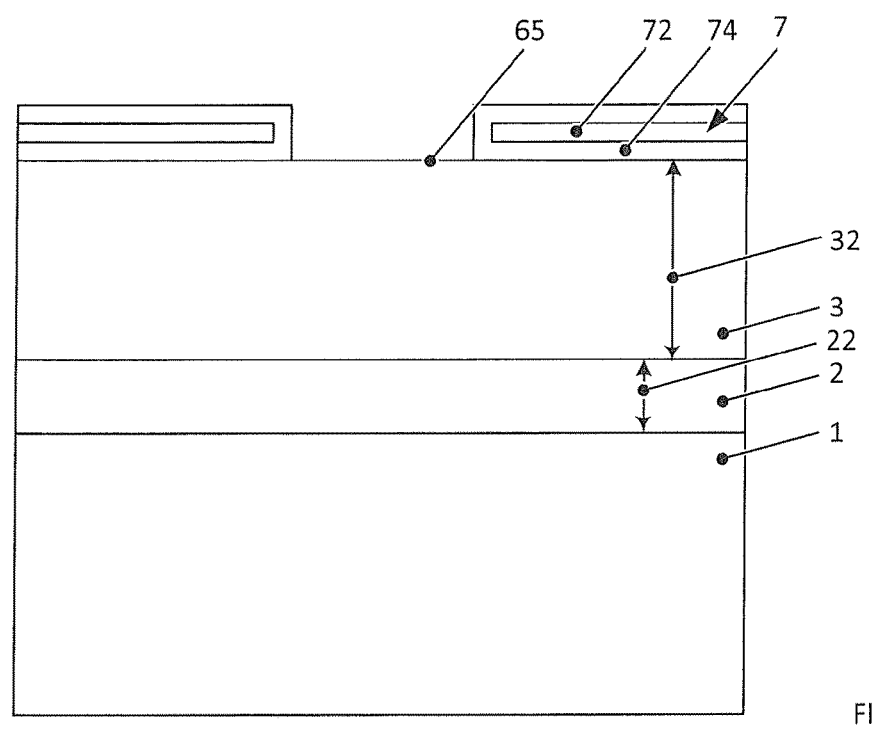
Figure 10:
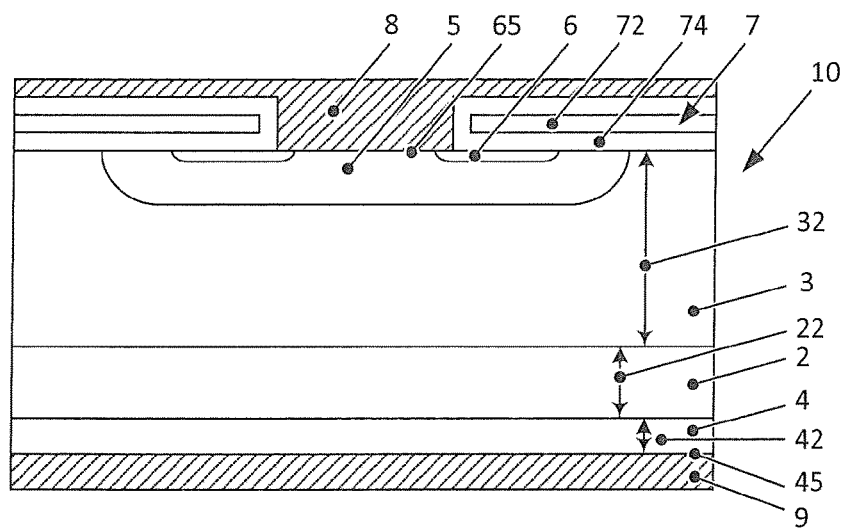
FIG. 10 shows an IGBT manufactured according to the inventive manufacturing method.
Figure 11:
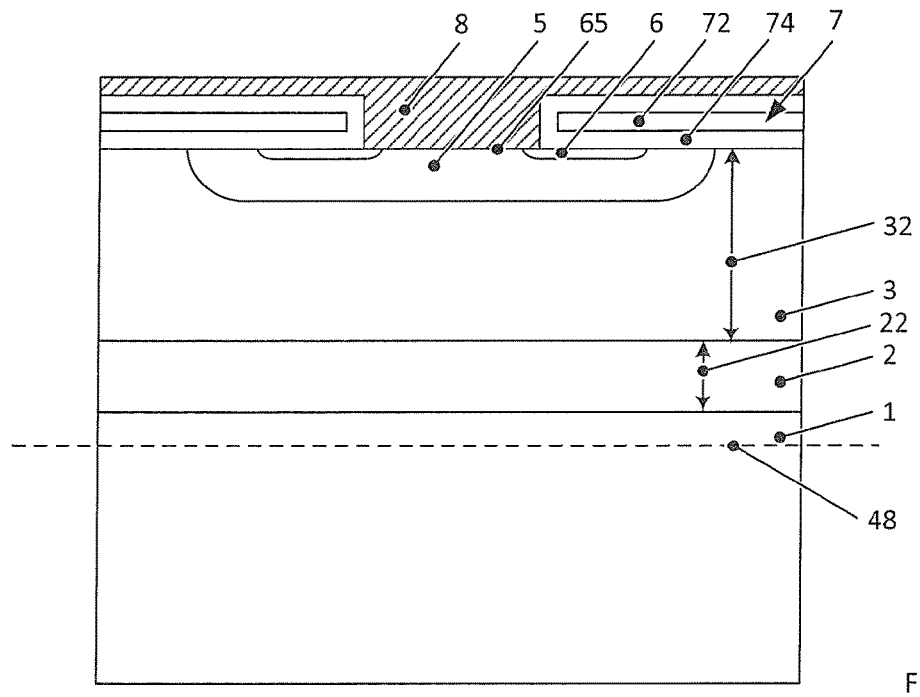
FIG. 11 shows different manufacturing steps according to the invention for the manufacturing of an IGBT.

Exemplarily, the gate electrode 7 is created after the creation of the buffer layer 2 and before creation of the emitter layer 6, base layer 5 and thinning 48 of the substrate (FIG. 5). The gate electrode 7 is created at the side opposite to the second side (i.e. on the emitter side 65). On the second side 14, a collector electrode 9 is created. The collector electrode 9, which is in contact to the collector layer 4, is created after the thinning of the substrate 1. The emitter electrode 8 is created after the gate electrode 7 and may be created before the thinning 48 of the substrate 1 (FIG. 11) or after the thinning 48 of the substrate 1, exemplarily it is created together with the collector electrode 9 (FIG. 10).

The FIGS. 12 to 18 show the doping concentrations of the layers during the manufacturing process. In these figures, the manufacturing is exemplarily shown for a P substrate 1.

Figure 12:
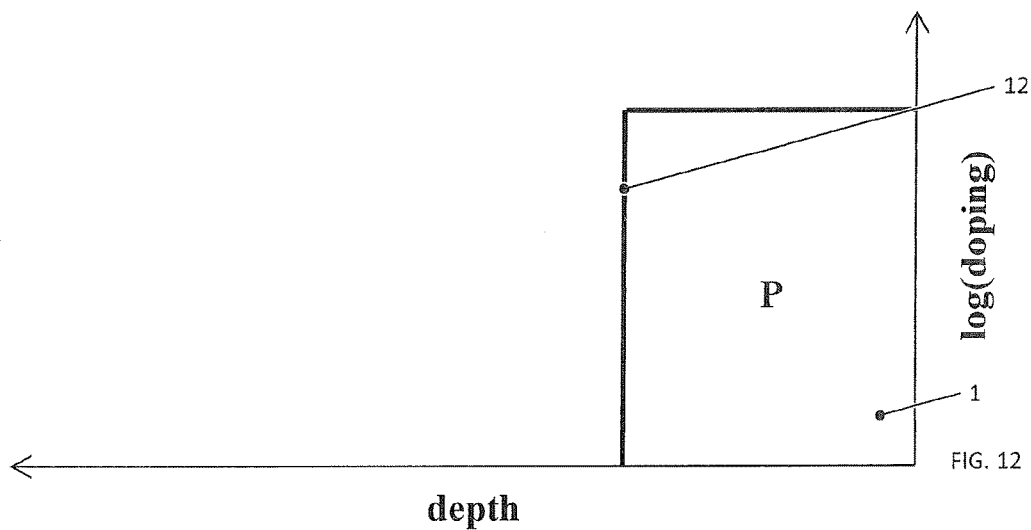
FIGS. 12 to 18 show the doping profiles during various steps of the manufacturing method.

Exemplarily, the substrate has a doping concentration of $(5*10^{15}$ to $1*10^{17})$ cm$^{-3}$ (FIG. 12). The doping concentration is so high that the collector layer 4 resulting as the remaining part of the substrate after thinning can provide a controlled injection.

The substrate thickness is chosen to be so thick that the substrate can be handled in the following manufacturing steps without a danger of cracks. Exemplarily, the substrate thickness is at least 300 μm.

Figure 13:
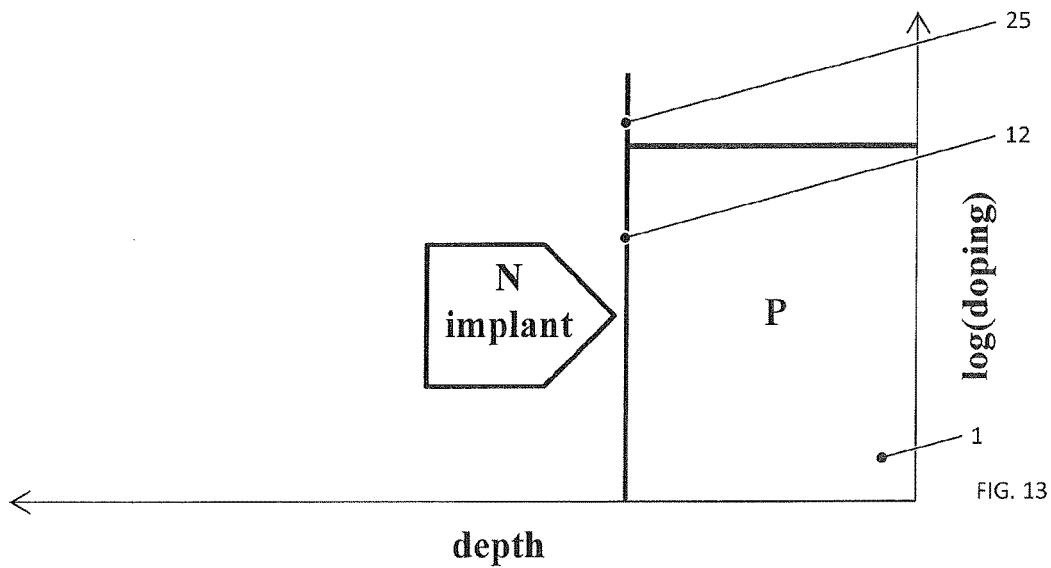

The first layer 25 may be created by applying ions on the first side, e.g. by implantation of a dopant (FIG. 13). Exemplary, the implantation dose may be $(1*10^{12}$ to $5*10^{13})$ cm$^{-2}$.

Alternatively, the first layer 25 may be created by epitaxially growing or depositing the first layer 25, exemplarily with a first layer thickness 27 between 0.5 . . . 2 μm, exemplarily 0.5 . . . 1 μm and/or a doping concentration of $1*10^{16}$ . . . $5*10^{17}$ cm$^{-3}$. The epitaxial first layer 25 comprises an n dopant, which is diffused in the later diffusion step such that the doping concentration decreases steadily without keeping a constant part of the doping concentration from the original epitaxial first layer 25. The dopant of the epitaxial layer diffuses into the substrate 1 as well as into the drift layer 3 so that the doping concentration of the buffer layer 2 increases on its side towards the substrate 1 to a maximum value, from which it steadily drops to the constant doping concentration of the drift layer 3. Thus, the epitaxial first layer 25 is so thin and the dopant is diffused such that the final diffused buffer layer 2 does not comprise any part of constant high doping concentration (i.e. from the doping concentration of the original first layer) in a direction perpendicular to the second side 14 (depth direction). That means that the doping concentration of the buffer layer changes steadily without keeping the same value in different depths.

For an epitaxial or deposited layer, the dopant of the epitaxial layer may be deeply diffused to at least 5 times the epitaxial first layer thickness, exemplarily to at least 10 times. The thickness of the layers is measured in depth direction (i.e. in a direction perpendicular to the first side 12 as the extension of the layer in the depth direction.

Figure 14:
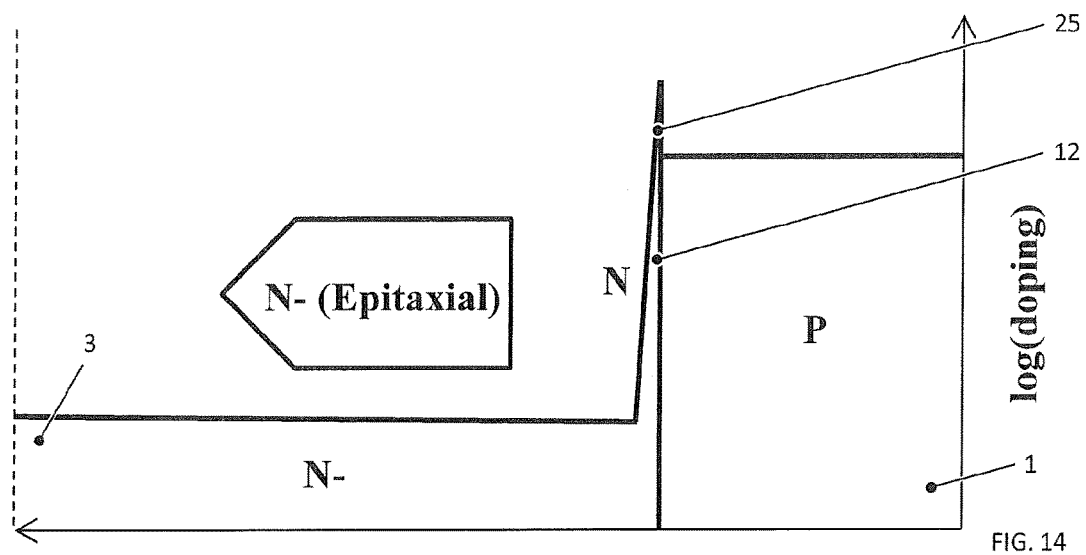
Figure 15:
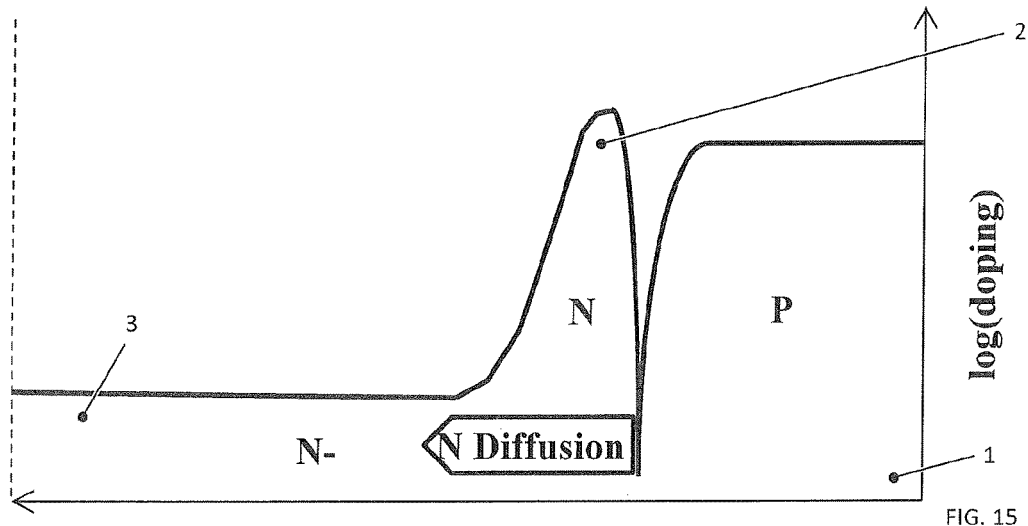

After the creation of the first layer 25, the drift layer 3 is created by epitaxial growth (FIG. 14). Then the buffer layer 2 is created by diffusing the dopant such that the diffused ions spread in an area of (5 to 30) μm (in depth direction, i.e. in a direction perpendicular to the second side 14, which corresponds to the collector side 45). The dopant diffuses into the drift layer 3 (FIG. 15). The buffer layer thickness 22 is, thus, 5 . . . 30 μm exemplarily 10 . . . 30 μm. The drift layer 3 in the finalized IGBT shall be the layer of unamended doping concentration by the diffusion step, i.e. of the doping concentration achieved by the epitaxial growth for the drift layer 3. Exemplarily, the drift layer 3 has a constantly low doping concentration. Therein, the substantially constant doping concentration of the drift layer 3 means that the doping concentration is substantially homogeneous throughout the drift layer 3, however without excluding that fluctuations in the doping concentration within the drift layer being in the order of a factor of one to five may be possibly present due to e.g. a fluctuations in the epitaxial growth process. The final drift layer thickness 32 and doping concentration is chosen due to the application needs. An exemplary doping concentration of the drift layer 5 is between $5*10^{12}$ cm$^{-3}$ and $5*10^{14}$ cm$^{-3}$.

The buffer layer 2 corresponds to the area, into which the dopant diffuses in the drift layer 3. On the side towards the substrate (collector layer 4), the buffer layer 2 extends to such area, in which the charge from the n doped dopant overbalances the charge from the p substrate.

The buffer layer 2 may have the same or a higher maximum doping concentration than the collector layer 4, i.e. the maximum doping concentration of the buffer layer may be at least as high as from the collector layer 4 (i.e. p substrate 1). In another alternative, the maximum doping concentration of the buffer layer 2 is lower than the doping concentration of the collector layer 4 (p substrate 1). As the substrate 1/p collector layer 4 is uniformly doped the maximum doping concentration of the p collector layer 4/p substrate 1 corresponds to the (local) doping concentration, whereas in the buffer layer 2 the doping concentration drops beyond the maximum doping concentration to greater depths, i.e. towards the emitter side 65, in the IGBT.

The maximum doping concentration of the buffer layer 2 may be between $1*10^{15}$ to $5*10^{16}$ cm$^{-3}$.

A sheet carrier concentration, which corresponds to an integral of the doping concentration (impurity ions) over the depth, is $1*10^{12}$ $5*10^{13}$ cm$^{-2}$ for an implanted layer and $2*10^{12}$ ... $1*10^{14}$ cm$^{-2}$ for an epitaxial or deposited layer having a thickness in the range of 0.5 ... 2 μm, or $2*10^{12}$ ... $5*10^{13}$ cm$^{-2}$ for an epitaxial or deposited layer having a thickness in the range of 0.5 ... 1 μm.

An exemplarily collector layer thickness 42 is (3 to 30) μm and the doping concentration may have a value in a range of $(5*10^{15}$ to $1*10^{17})$ cm$^{-3}$.

Figure 16:
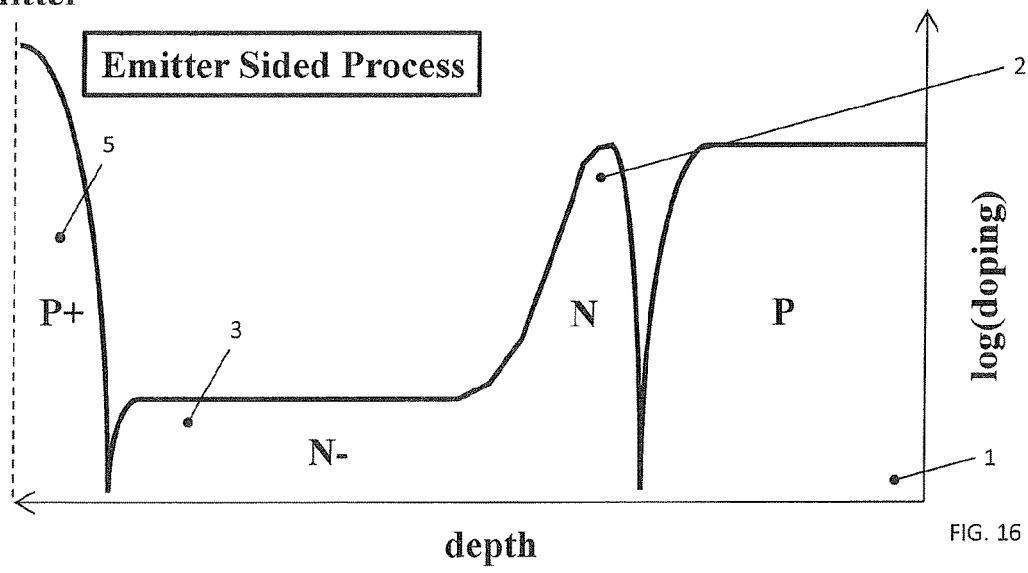
Figure 17:
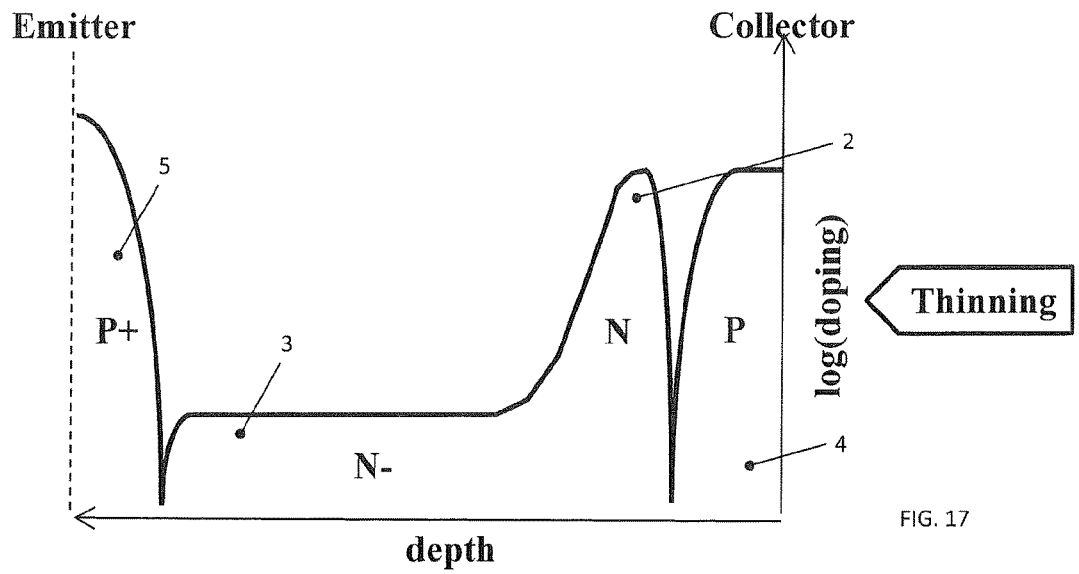
Figure 18:
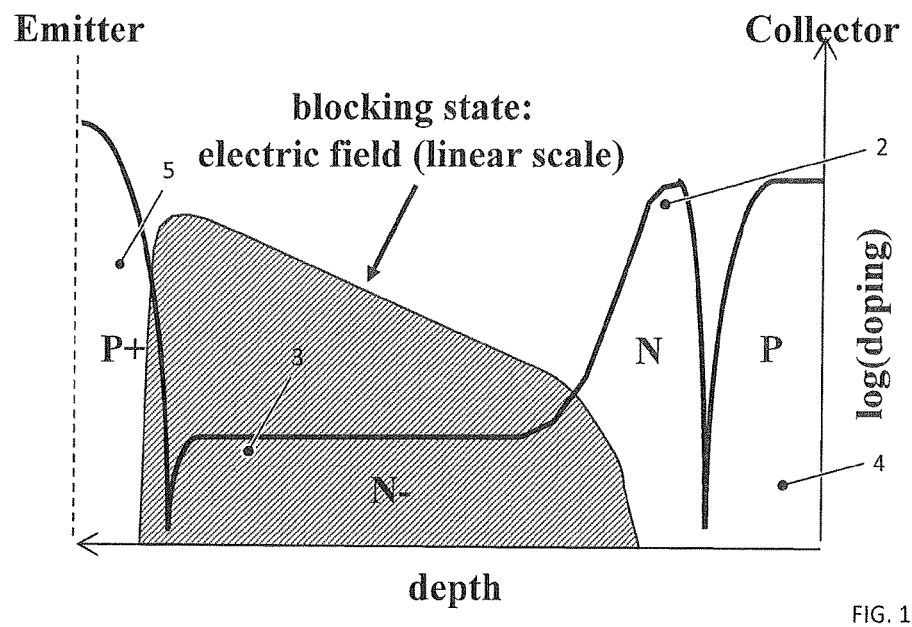

FIG. 16 shows the half-finished device, in which the emitter sided processes have been done, exemplarily shown as the p doped base layer 5. FIG. 17 shows the half-finished device after the collector-sided thinning of the substrate 1, thus creating the collector layer 4. FIG. 18 shows for the final device the electric field, which is stopped within the buffer layer 2.

The gate electrode 7 is created either as a planar or trench gate electrode. The gate electrode 7 is made by a method well known to persons skilled in the art.

The finalized IGBT may have a planar gate electrode (as shown in FIG. 10), which comprises an electrically insulating layer 74 on top of the emitter side 65. An electrically conductive gate layer 72 is arranged on the insulating layer 74, thus insulated from any n or p doped layer in the IGBT. Thus, the insulating layer 74 insulates the gate layer 72 from any n or p doped layer in the IGBT extending to the emitter side 65 in an area below the gate layer 72. The gate layer 72 is exemplarily also covered by the insulating layer 74, by which insulating layer 74 the gate layer 72 is also insulated from the emitter electrode 8. Thus, exemplarily, the gate layer 72 is exemplarily completely embedded in the insulating layer 74. The gate layer 72 is exemplarily made of a heavily doped polysilicon or a metal like aluminum. The gate layer 72 is arranged on the emitter side 65 laterally to an emitter contact area. It extends to an area above the base layer 5, the emitter layer 6 as well as the drift layer 3. The at least one emitter layer 5, the gate layer 72 and the electrically insulating layer 74 are formed in such a way that an opening, which is the emitter contact area, is created above the base layer 5. The emitter contact area is surrounded by the emitter layer 5, the gate layer 72 and the electrically insulating layer 74.

The emitter electrode 8 is arranged on the emitter side 65 and contacts the base layer 5 and the emitter layer 6 at the emitter contact area. The emitter electrode 8 exemplarily also covers the electrically insulating layer 74, but is separated and thus electrically insulated from the gate layer 72 by the insulating layer 74.

Alternatively to the inventive IGBT with a planar gate electrode, the inventive IGBT may comprise a gate electrode formed as trench gate electrode. The trench electrode is arranged in the same plane as the base layer 5 in a recess in the semiconductor material and adjacent to the emitter layer 6, separated from each other by an insulating layer 74, which also separates the gate layer 72 from the drift layer 3. The insulating layer 74 is also arranged on top of the gate layer 72, thus insulating the trench gate layer 72 from the emitter electrode 8.

The IGBT manufactured from the inventive method, may also comprise a highly p+ doped contact layer, which is arranged in between the emitter contact area and the p doped base layer 5 in order to have a highly doped interlayer at the contact to the emitter electrode 8. The p contact layer may be limited to the area at which a p doped layer is in contact to the emitter electrode 8, i.e. at the emitter contact area. The contact layer may have a maximum doping concentration between $5\times10^{18}$/cm$^3$ and $5\times10^{19}$/cm$^3$. The contact layer may also be formed as a diffused layer, i.e. as the p doped layers overlay each other, and the doping concentration of each layer decreases, but the contact layer is arranged up to a first depth, which is smaller than the of the base layer depth/thickness (measured from the emitter side 65). The contact layer and base layer 5 overlap such that at the cross point a discontinuous decrease of the doping concentration is present. The contact layer is created by applying p doped ions (either by implantation or deposition) and diffusing them into the device up to a depth, which is smaller than the depth of the base layer from the emitter side 65. It is about the thickness of the emitter layer 6.

In another embodiment, the conductivity types are switched, i.e. all layers of the first conductivity type are p type (e.g. the drift layer 3) and all layers of the second conductivity type are n type (e.g. collector layer 4).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for manufacturing an insulated gate bipolar transistor, which includes a drift layer of a first conductivity type between an emitter side, at which a gate electrode and an emitter electrode are arranged, and a collector side opposite to the emitter side, at which a collector electrode is arranged, wherein the manufacturing method comprises manufacturing steps in the following order:

providing a substrate of a second conductivity type, which is opposite to the first conductivity type, the substrate of the second conductivity type having a first side and a second side opposite to the first side, and the substrate of the second conductivity type having a doping concentration of $5*10^{15}$ to $1*10^{17}$ cm$^{-3}$, creating a first layer of the first conductivity type on the first side by applying a dopant of the first conductivity type by epitaxial growth or deposition, resulting in the first layer having a first layer thickness between 0.5 and 2 µm, creating a drift layer of the first conductivity type on the first layer, which has a low doping concentration, diffusing the dopant such that a buffer layer is created, the buffer layer having a higher doping concentration than the drift layer, wherein in a direction perpendicular to the second side, the buffer layer does not comprise an area of constant doping concentration, creating a base layer of the second conductivity type on the drift layer, creating an emitter layer of the first conductivity type on the base layer, thinning the substrate on the second side such that the remaining part of the substrate forms a collector layer having the collector side to which the collector electrode is formed.

2. The method for manufacturing an insulated gate bipolar transistor according to claim 1, characterized in that the substrate has a substrate thickness of at least 300 µm.

3. The method for manufacturing an insulated gate bipolar transistor according to claim 1, characterized in that the dopant is applied by implantation, in particular with a dose of $1*10^{12}$ to $5*10^{13}$ cm$^{-2}$.

4. The method for manufacturing an insulated gate bipolar transistor according to claim 1, characterized in that the first layer has at least one of a first layer thickness between 0.5 and 1 µm, or a doping concentration of $1*10^{16}$ to $5*10^{17}$ cm$^{-3}$.

5. The method for manufacturing an insulated gate bipolar transistor according to claim 4, characterized in that the step of diffusing comprises diffusing the first layer to at least 5 or at least 10 times the first layer thickness.

6. The method for manufacturing an insulated gate bipolar transistor according to claim 4, characterized in that a buffer layer thickness of the buffer layer is 5 to 30 µm.

7. The method for manufacturing an insulated gate bipolar transistor according to claim 4, characterized in that the buffer layer has a maximum doping concentration between $1*10^{15}$ to $5*10^{16}$ cm$^{-3}$.

8. The method for manufacturing an insulated gate bipolar transistor according to claim 1, characterized in that the step of diffusing comprises diffusing the first layer to at least 5 or at least 10 times the first layer thickness.

9. The method for manufacturing an insulated gate bipolar transistor according to claim 1, characterized in that a buffer layer thickness of the buffer layer is 5 to 30 µm.

10. The method for manufacturing an insulated gate bipolar transistor according to claim 9, characterized in that the buffer layer thickness of the buffer layer is 10 to 30 µm.

11. The method for manufacturing an insulated gate bipolar transistor according to claim 1, characterized in that the buffer layer has the same or a higher maximum doping concentration than the collector layer.

12. The method for manufacturing an insulated gate bipolar transistor according to claim 1, characterized in that the buffer layer has a lower maximum doping concentration than the collector layer.

13. The method for manufacturing an insulated gate bipolar transistor according to claim 1, characterized in that the buffer layer has a maximum doping concentration between $1*10^{15}$ and $5*10^{16}$ cm$^{-3}$.

14. The method for manufacturing an insulated gate bipolar transistor according to claim 1, characterized in that the collector layer has a collector layer thickness of 3 to 30 µm.

15. The method for manufacturing an insulated gate bipolar transistor according to claim 1, characterized in that creating the drift layer is done by epitaxial growth.

16. The method for manufacturing an insulated gate bipolar transistor according to claim 1, characterized in that the step of diffusing comprises diffusing the dopant so that the doping concentration of the buffer layer decreases steadily without keeping a constant part of a doping concentration from the original first layer.

17. The method for manufacturing an insulated gate bipolar transistor according to claim 16, characterized in that the doping concentration of the buffer layer increases on a side of the buffer layer towards the substrate to a maximum value, from which the doping concentration steadily decreases to the doping concentration of the drift layer, wherein the doping concentration of the drift layer is constant.

* * * * *